United States Patent [19]
Brown et al.

[11] Patent Number: 5,962,113
[45] Date of Patent: Oct. 5, 1999

[54] INTEGRATED CIRCUIT DEVICE AND PROCESS FOR ITS MANUFACTURE

[75] Inventors: Hugh Ralph Brown, New South Wales, Australia; Kenneth Raymond Carter, San Jose, Calif.; Hyuk-Jin Cha, Taejon, Rep. of Korea; Richard Anthony Dipietro, San Jose; James Lupton Hedrick, Pleasanton, both of Calif.; John Patrick Hummel, Millbrook, N.Y.; Robert Dennis Miller, San Jose; Do Yeung Yoon, Los Gatos, both of Calif.

[73] Assignee: International Business Machines Corporation, Armonk, N.Y.

[21] Appl. No.: 08/739,144

[22] Filed: Oct. 28, 1996

[51] Int. Cl.$^6$ ............................ B32B 3/10; B32B 15/08
[52] U.S. Cl. .................... 428/209; 428/450; 428/458; 428/473.5; 428/901
[58] Field of Search ................... 428/209, 450, 428/458, 473.5, 901

[56] References Cited

U.S. PATENT DOCUMENTS

| | | | |
|---|---|---|---|
| 3,732,181 | 5/1973 | Ray et al. ............................... | 523/207 |
| 4,141,877 | 2/1979 | Luttinger et al. ....................... | 524/492 |
| 4,535,099 | 8/1985 | Lee et al. ................................ | 521/154 |
| 5,036,145 | 7/1991 | Echterling et al. ..................... | 525/431 |
| 5,043,369 | 8/1991 | Bahn et al. .............................. | 523/466 |
| 5,206,337 | 4/1993 | Takeda et al. .......................... | 528/313 |
| 5,252,654 | 10/1993 | David et al. ............................. | 524/414 |
| 5,288,842 | 2/1994 | Feger et al. ............................. | 528/335 |
| 5,384,376 | 1/1995 | Tunney et al. .......................... | 525/431 |
| 5,412,016 | 5/1995 | Sharp ...................................... | 524/430 |
| 5,767,014 | 6/1998 | Hawker et al. .......................... | 438/623 |

OTHER PUBLICATIONS

L. Mascia, Developments in Organic–Inorganic Polymeric Hybrids: Ceramers, Trends in Pol. Sci. vol. 3, No. 2, Feb. 1995.

A. Morikawa, "Preparation of New Polyimide–Silica Hybrid Materials via the Sol–Gel Process", J. Mater. Chem., 1992, 2(7), 679–690.

T. Homma et al., "Stability of a new polyimide siloxane film as interlayer dielectrics of ULSI multilevel interconnections", Thin Solid Films, 235 (1993) pp. 80–113.

W. Volksen et al., "Polyamic Alkyl Esters: Versatile Polyimide Precursors for Improved Dielectric Coatings", IEEE Trans. On Components, Hybrids and Manufacturing Tech. vol. 15, No. 1, Feb. 1992.

A. Morikawa et al., "Preparation of a New Class of Polyimide–Silica Hybrid Films by Sol–Gel Process,", Polymer Journal, vol. 24, No. 1, pp. 107–113 (1992).

W. Volksen et al., "Condensation Polyimides" Synthesis, Solution Behavior and Imidization Characteristics, High Performance Polymers, Advances in Pol. Sci., vol. 117, (1994).

Y. Chujo et al., "Organic Polymer Hybrids with Silica Gel Formed by Means of the Sol–Gel Method", Advances in Polymer Science, vol. 100.

C. McDermott, "Foamed Thermoset and Thermoplastic Polymer Combinations", IBM Technical Disclosure Bulletin, vol. 8, No. 12, May 1996.

(List continued on next page.)

*Primary Examiner*—D. S. Nakarani
*Attorney, Agent, or Firm*—Robert B. Martin

[57] ABSTRACT

The invention relates to an integrated circuit device comprising (i) a substrate; (ii) metallic circuit lines positioned on the substrate and (iii) a dielectric material positioned on the circuit lines. The dielectric material comprises the reaction product of an organic polysilica and polyamic ester preferably terminated with an alkoxysilyl alkyl group.

12 Claims, 2 Drawing Sheets

OTHER PUBLICATIONS

R. Munroe, "Method for Curing and Holding Semiconductors for Organic Encapsulation", IBM Technical Disclosure Bulletin, vol. 27, No. 7A, Dec. 1984.

E. Babich et al., "Low Viscosity and High Temperature Stable Gap Filling Material for Glass/Ceramic Substrates", IBM Technical Disclosure Bulletin, vol. 37, No. 07, Jul. 1994.

T. Saegusa et al., "An Organic/Inorganic Hybrid Polymer", J. Macromol. Sci.—Chem., A27(13&14), pp. 1603–1612 (1990).

J. Hilborn et al., "Poly(aryl ether–benzoxazoles)", Macromolecules, vol. 23, No. 11, 1990.

J. L. Hedrick, Poly(aryl ether benzothiazoles), Macromolecules, vol. 24, No. 23, 1991.

W. Joseph et al., "Synthesis and characterization of fluorinated polybenzoxazoles via solution cyclization techniques", Polymer, vol. 35, No. 23, (1994).

W. Joseph et al., "Synthesis and Characterization of Fluorinated Polybenzoxales via Solution Cyclization Techniques", Polymer Preprints, vol. 34, No. 1, Mar. 1993, American Chem. Society.

W. Joseph et al., "Synthesis of Bis–A Based Polybenzoxales via Acid–Catalyzed Solution Cyclization", Polymer Preprints, vol. 33, No. 1, Apr. 1992, American Chem. Society.

W. Joseph et al., "Synthesis of 4,4'–isopropylidene diphenol (bisphenol A) based polybenzoxazoles via an acid–catalyzed solution cyclization process", Polymer 1993, vol. 34, No. 4.

INTEGRATED CIRCUIT DEVICE AND PROCESS FOR ITS MANUFACTURE

FIELD OF THE INVENTION

The present invention relates to an integrated circuit comprising an improved dielectric material and process for manufacturing the integrated circuit.

BACKGROUND OF THE INVENTION

There is a continuing desire in the microelectronics industry to increase the circuit density in multilevel integrated circuit devices e.g., memory and logic chips, thereby increasing their performance and reducing their cost. In order to accomplish this goal, there is a desire to reduce the minimum feature size on the chip e.g., circuit linewidth, and also to decrease the dielectric constant of the interposed dielectric material to enable closer spacing of circuit lines without an increase in crosstalk and capacitive coupling. Further, there is a desire to reduce the dielectric constant for the dielectric materials such as utilized in the back end of the line (BEOL) portion of integrated circuit devices, which contain input/output circuitry, to reduce the requisite drive current and power consumption for the device. The present dielectric is silicon dioxide which has a dielectric constant of about 4.0. This material has the requisite mechanical and thermal properties to withstand processing operations and thermal cycling associated with semiconductor manufacturing. However, it is desired that dielectric materials for future integrated circuit devices exhibit a lower dielectric constant (e.g., <3.0) than exhibited by silicon dioxide.

It is therefore an object of the present invention to provide an improved integrated circuit device comprising an improved dielectric material.

Other objects and advantages will be apparent from the following disclosure.

SUMMARY OF THE INVENTION

The present invention relates to an integrated circuit device comprising (i) a substrate; (ii) interconnecting metallic circuit lines positioned on the substrate and (iii) a dielectric material positioned contiguous to the circuit lines (over and/or between the circuit lines). The dielectric material comprises the reaction product of an organic polysilica and polyamic ester terminated preferably with a trialkoxysilylalkyl group. In one embodiment, the organic polysilica is silsesquioxane and the dielectric material has phase domains less than 0.5 microns.

The present invention also relates to an integrated circuit packaging structure, the material composition and the processes for forming the integrated circuit device of the present invention.

A more through disclosure of the present invention is presented in the detailed description which follows and from the accompanying drawings.

DETAILED DESCRIPTION OF THE INVENTION

Figure 1:
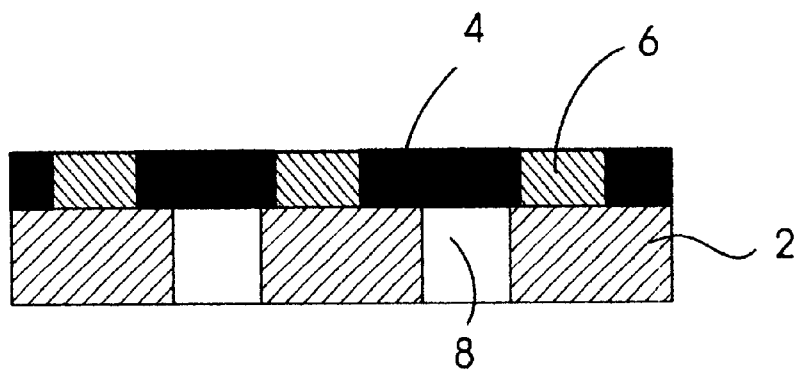
FIG. 1 is a cross-sectional view of a portion of the integrated circuit device of the present invention.

An embodiment of the integrated circuit device of the present invention is shown in FIG. 1. The device generally comprises substrate 2, metallic circuit lines 4 and dielectric material 6. The substrate 2 has vertical metallic studs 8 formed therein. The circuit lines function to distribute electrical signals in the device and to provide power input to and signal output from the device. Suitable integrated circuit devices will generally comprise multiple layers of circuit lines which are interconnected by vertical metallic studs.

Suitable substrates for the device of the present invention comprises silicon, silicon dioxide, glass, silicon nitride, ceramics, aluminum, copper and gallium arsenide. Other suitable substrates will be known to those skilled in the art. In a multilayer integrated circuit device, an underlying layer of insulated, planarized circuit lines can also function as a substrate.

Suitable circuit lines generally comprise a metallic, electrically conductive material such as copper, aluminum, tungsten, gold, silver or alloys thereof. Optionally, the circuit lines may be coated with a metallic liner such as a layer of nickel, tantalum or chromium or other layers such as barrier or adhesion layers (e.g., SiN, TiN).

Another embodiment of the present invention relates to an integrated circuit packaging device (multichip module) for providing signal and power current to a one or more integrated circuit chips comprising: (1) a substrate having electrical conductor for connection to a circuit board, (ii) a plurality of alternating electrically insulating and conducting layers positioned on the substrate wherein at least of the conducting layers comprises the improved dielectric film of the present invention and (iii) a plurality of vias for electrically interconnecting electrical conductor, conducting layers and integrated circuit chips.

The integrated circuit packaging device is an intermediate level of packaging between the integrated circuit chip and the circuit board. The integrated circuit chips are mounted on the integrated circuit packaging device which is in turn mounted on the circuit board.

The substrate of the packaging device is generally an inert substrate such as glass, silicon or ceramic. The substrate can optionally have integrated circuits disposed therein. The substrate is provided with electrical conductor such as input/output pins (I/O pins) for electrically connecting the packaging device to the circuit board. A plurality of electrically insulating and electrically conducting layers (layers having conductive circuits disposed in an dielectric insulating material) are alternatively stacked up on the substrate. The layers are generally formed on the substrate in a layer by layer process wherein each layer is formed in a separate process step.

The packaging device also comprises receiving means for receiving the integrated circuit chips. Suitable receiving means include pinboards for receipt of chip I/O pins or metal pads for solder connection to the chip. Generally, the packaging device also comprises a plurality of electrical vias generally vertically aligned to electrically interconnect the I/O pins, the conductive layers and integrated circuit chips disposed in the receiving means. The function structure and method of manufacture of the integrated circuit packaging devices are well known to those skilled in the art disclosed in U.S. Pat. Nos. 4,489,364, 4,508,981, 4,628,411 and 4,811,082, the disclosures of which are incorporated herein by reference.

The key feature of the present invention is the dielectric material which is positioned over the circuit lines and/or between the circuit lines and on the substrate. In multilevel integrated circuit devices, the dielectric material is often planarized to function as a substrate for lithographic formation of the next layer of circuit lines. The dielectric material comprises the reaction product of an organic polysilica and a polyamic ester terminated (end group) with $(RO)_m(R'')_nSiR'—$, where m is 1, 2 or 3; m+n=3; R and R' are hydrocarbyl groups and R" is hydrido or a hydrocarbyl group. The end group is preferably a mono, di or tri $C_{1-6}$ alkoxysilyl $C_{1-6}$ alkyl or aryl group (e.g., phenylene, benzylene, napthylene or anthracenylene) group.

As used herein, hydrocarbyl group means hydrocarbon based group (mono or difunctional) having a carbon atom attached to the remainder of the molecule and having predominantly hydrocarbon character. Hydrocarbyl groups include the following:

(1) Hydrocarbon groups; that is, aliphatic, (e.g., $C_1$–$C_{10}$ alkyl or alkenyl and $C_{5-10}$ cycloalkyl or cycloalkenyl), aromatic, aliphatic substituted aromatic, aromatic-substituted aliphatic and the like. Such groups are known to those skilled in the art; examples include methyl (methylene for difunctional hydrocarbyl group) ethyl, butyl, hexyl, octyl, decyl, dodecyl, tetradecyl, octadecyl, cyclohexyl, phenyl, naphthyl, benzyl and anthracenyl (all isomers being included).

(2) Substituted hydrocarbon groups; that is, groups containing non-hydrocarbon substituents which, in the context of this invention, do not alter predominantly hydrocarbon character of the group. Those skilled in the art will be aware of suitable substituents (e.g., halo, alkoxy, carbalkoxy, nitro, alkylsulfoxy).

(3) Hetero groups; that is, groups which, while predominantly hydrocarbon in character within the context of this invention, contain atoms other than carbon present in a chain or ring otherwise composed of carbon atoms. Suitable hetero atoms will be apparent to those skilled in the art and include, for example, nitrogen, oxygen and sulfur.

In general, no more than about three substituents or hetero atoms, and preferably no more than one, will be present for each 10 carbon atoms in the hydrocarbon-based group.

The polyamic ester with the end group is preferably formed from the reaction of (i) a diamine; (ii) a diester diacyl halide (preferably chloride) and (iii) an aminoalkoxysilane. where diamines have the formula $H_2NRNH_2$ wherein R is

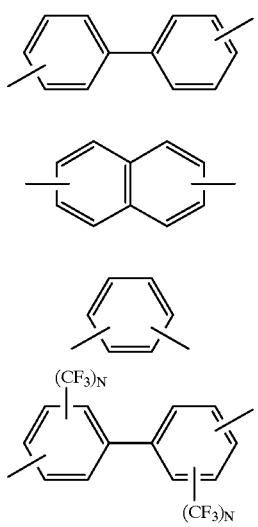

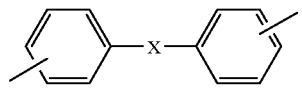

wherein X is selected from the group consisting of an alkylene chain having 1–3 carbon or halocarbon atoms, carbonyl, —O—, —SO$_2$— and —N-alkyl. The alkylene chain can further be substituted with haloalkyl (e.g., trifluoromethyl) and phenyl. The aromatic ring can optionally be substituted by a e.g., trifluoromethoxy or the like. Suitable R for the diamine include:

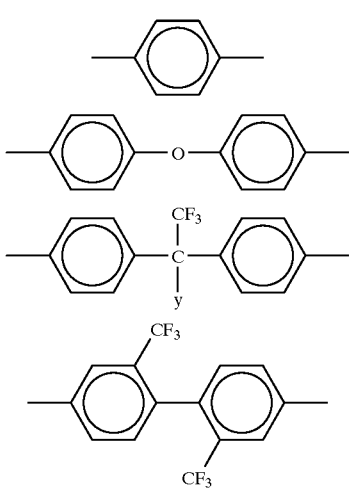

where y is selected from trifluoromethyl, phenyl or substituted phenyl. Suitable aromatic diamines are:

p-phenylene diamine;
4,4'-diamino-diphenylamine; benzidine;
4,4'-diamino-diphenyl ether;
1,5-diamino-naphthalene;
3,3'-dimethyl-4,4'diamino-biphenyl;
3,3'-dimethoxy benzidine;
1,4-bis(p-aminophenoxy)benzene;
1,3-bis(p-aminophenoxy)benzene;
2,2-bis[4-aminophenyl]hexafluoropropane The R in the diamine may also be an aliphatic or cycloaliphatic group such as cycloalkylene e.g., cyclohexylene. Suitable aliphatic diamines include 1,4-diaminocyclohexane and bis(4-aminocyclohexyl)methane.

A preferred diamine is a diamine wherein X in the above formula is >C (phenyl) (trifluoromethyl). Preferred diamines are 9,9'-bis(4-aminophenyl)fluorene (FDA); 4,4'-oxydianiline and 1,1-bis(4-aminophenyl)-1-phenyl-2,2,2-trifluoroethane (3FDA).

The diester diacyl chloride is suitably made from the corresponding dianhydride suitably having the formula

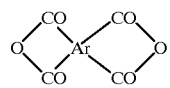

wherein Ar may be selected from.

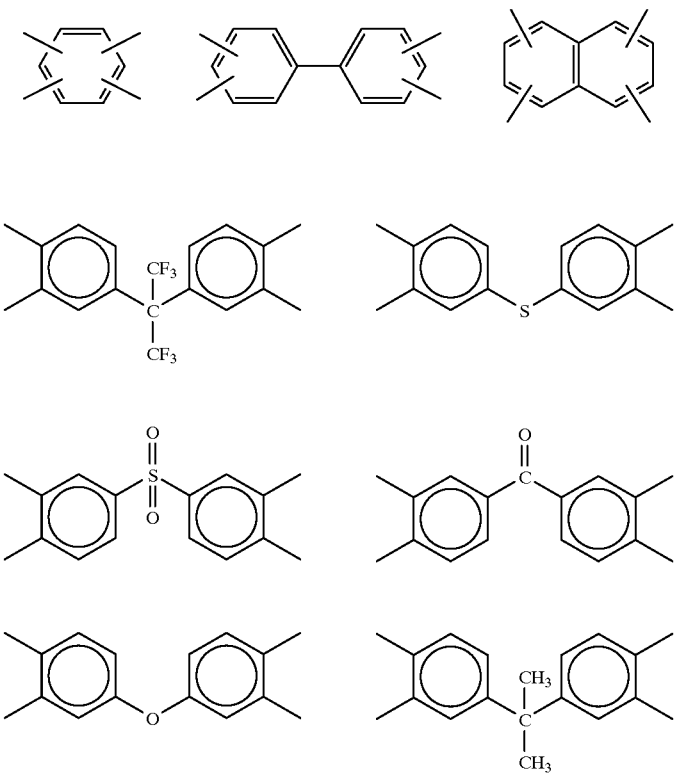

Suitable dianhydrides include:
pyromellitic dianhydride
benzophenone dianhydride
2,2-bis(3,4-dicarboxyphenyl)propane dianhydride
3,3',4,4'-biphenyltetracarboxylic acid dianhydride
bis(3,4-dicarboxyphenyl)ether dianhydride
bis(3,4-dicarboxyphenyl)thioether dianhydride
bisphenol A bisether dianhydride
2,2-bis(3,4-dicarboxylphenyl)hexafluoropropane dianhydride
2,3,6,7-naphthalenetetracarboxylic acid dianhydride
bis(3,4-dicarboxyphenyl)sulfone dianhydride
1,2,5,6-naphthalene tetracarboxylic dianhydride;
2,2',3,3'-biphenyl tetracarboxylic dianhydride
3,4,3'4'benzophenone tetracarboxylic dianhydride; and terphenyldianhydride A preferred diester diacyl chloride is diethyl pyromellitate diacyl chloride.

The diester diacyl chloride is formed by sequentially reacting the corresponding anhydride with a suitable alcohol and oxalyl chloride. A suitable alcohol is ethanol. The rate of imidization can be varied by the electronic substituent effect of the ester group (e.g., ethyl ester substituent from ethanol) and other suitable alcohols for use in the present invention will be known to those skilled in the art such as disclosed on page 139 of "High Performance Polymers" by Hergenrother (1994), the disclosure of which is incorporated herein by reference. Suitable diester diacyl chlorides are diethyldichloropyromellitate, diethyl dichlorobiphenyl tetracarboxylate and diethyldichloro oxydiphthalate. Other suitable diamines and diester diacyl chlorides will be known to those skilled in the art such as those disclosed in U.S. Pat. No. 4,720,539 and copending commonly assigned U.S. patent application Ser. No. 08/058,303 filed May 10, 1992, the disclosures of which are incorporated herein by reference for all purposes.

Suitable aminoalkoxysilane has the formula $(H_2NR'Si(R'')_m(OR)_n)$ where m+n=3 (n is preferably 3) R is preferably $C_{1-6}$ alkyl and R' is a spacer group preferably a $C_{1-6}$ alkylene (e.g., methylene) or a nonheteroatom aryl group (a hydrocarbon aromatic group without heteroatoms) such as phenylene, benzylene or napthylene) which is positioned between the amino group and the silicon atom. Since R is cleaved and removed from the composition during the reaction, R can be any organic group which does not unacceptably interfere with the reaction and those groups should be contemplated as equivalent to those claimed herein. If n is less than 3, R'' is preferably hydrido or lower $C_{1-6}$ alkyl. A preferred silane is aminophenyltrimethoxysilane. Other suitable silane reactants will be known to those skilled in the art.

To form the polyamic ester reactant, the three precursors are dissolved in a suitable solvent (such as NMP) in proper stoichiometric amounts (e.g., diamine and diester diacyl chloride in 1:1 with the amount of silane calculated from the Carothers equation to provide the desired molecular weight of the polymer product) resulting in alkoxy silylalkyl end capping of the polyamic ester. The alkoxysilylalkyl end capped polyamic ester reactant will have a molecular weight (Mn) of about 5,000 to 20,000 g/mol. A suitable alkoxysilylalkyl end capped polyamic ester has the structure:

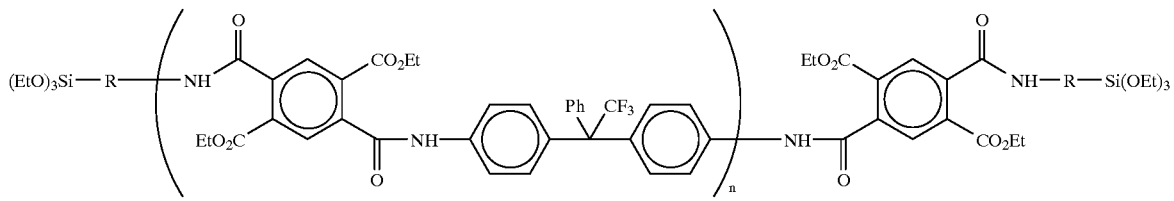

wherein R is phenyl or $C_{1-6}$ alkyl and the polyamic ester substituent is ethyl.

Organic polysilica is a polymeric compound comprising silicon, carbon, oxygen and hydrogen atoms. Suitable organic polysilica include (i) partially condensed alkoxysilanes (e.g., partially condensed by controlled hydrolysis $C_{1-6}$ alkoxysilane having an Mn of about 500 to 20,000 e.g. tetraethoxysilane); (ii) organically modified silicates having the composition $RSiO_3$ and $R_2SiO_2$ wherein R is an organic substituent (iii) partially condensed orthosilicates having the composition $SiOR_4$ (iv) siloxanes and (v) silsesquioxanes. Silsesquioxanes are polymeric silicate materials of the type $RSiO_{1.5}$ where R is an organic substituent.

Suitable organic polysilica for use in the present invention are known to those skilled in the art. Preferably, the organic polysilica is a tetraethoxysilane, silsesquioxane or a mixture thereof. Suitable silsesquioxane for the present invention is alkyl(methyl)phenyl silsesquioxane which is commercially available (e.g., GR950 from Techniglass Perrysburg, Ohio). Other suitable silsesquioxanes will be known to those skilled in the art such as disclosed in U.S. Pat. No. 5,384,376 and Chem. Rev. 95, 1409–1430 (1995), the disclosures of which are incorporated herein by reference.

The dielectric composition suitably comprises about 5 to 95 weight % of the polyimide component and is formed in a two step process. The first step involves dissolving the silsesquioxane and the alkoxysilylalkyl end capped polyamic ester in a suitable solvent (high boiling solvent e.g., N-methyl-2-pyrrolidone NMP) at room temperature. The composition is heated to an elevated temperature directly or in a step wise fashion (e.g., 200° C. for 2 hrs. and then ramped up to 400° C. and held for 2 hrs.) to cause chain extension and imidization of the polyamic ester, and cross condensation of the functionalized polyimide with the polysilica.

The dielectric composition of the present invention has a dielectric constant less than 3.2 preferably less than 3 and more preferably less than 2.9 at 80° C. The composition has phase domains less than 0.5 microns, preferably less than 0.3 microns, which result in enhanced mechanical and polishing characteristics and enhanced isotropic, optical and dielectric properties. Further, the dielectric composition has mechanical properties that resist cracking and enable it to be chemically/mechanically planarized to facilitate lithographic formation of additional circuit levels in multilevel integrated circuit devices. The dielectric composition has increased breakdown voltage, enhanced toughness and increased crack resistance, even in high ambient humidity with a thick film. The dielectric composition is optically clear and adheres well to the substrate. The dielectric composition undergoes minimal shrinkage during heating.

The composition formed by the reaction of organic polysilica and the end group terminated polyamic ester also has other utilities such as a protective coating on contact lens and mirrors and other objects for use in outer space.

Figure 2:
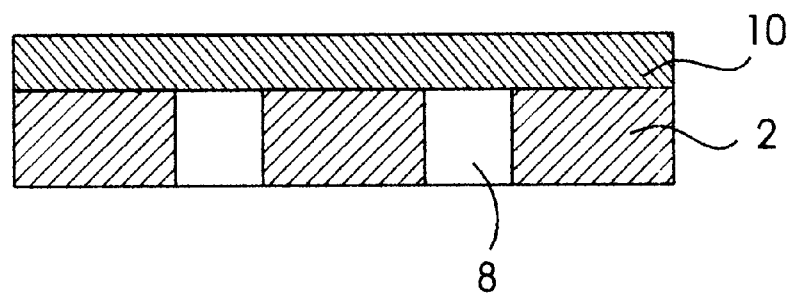
FIGS. 2–5 show a process for making the integrated circuit device of the present invention.

The present invention also relates to processes for manufacturing the integrated circuit device. Referring to FIG. 2, the first step of one process embodiment involves disposing on a substrate 2 a layer 10 of the dielectric composition of the present invention comprising trialkoxysilylalkyl end capped polyamic ester and a silsesquioxane. The substrate 2 is shown with vertical metallic studs 8. The composition is dissolved in a suitable solvent such as N,N'dimethylpropyleneurea (DMPU), NMP or the like and is applied to the substrate by art known methods such as spin or spray coating or doctor blading. The second step of the process involves heating the composition to an elevated temperature to both imidize the polyamic ester and to cross condense the silyl reactive groups by the sol-gel process. Preferably, the composition is heated in the presence of a base such as an amine or Bronsted base. The base catalyzes both the imidization and cross condensation reaction enabling a lower initial cure temperature e.g., below 200° C. Suitably, the base is an organic amine. The amine will preferably have a high boiling point and is removable by heating upon completion of the reaction. A suitable base is N-methyldiethanolamine. Other suitable bases will be known to those skilled in the art such as disclosed in U.S. Pat. No. 5,206,117, the disclosure of which is incorporated herein by reference for all purposes. Similarly, the reaction can be catalyzed by Bronsted or Lewis acids.

Figure 3:
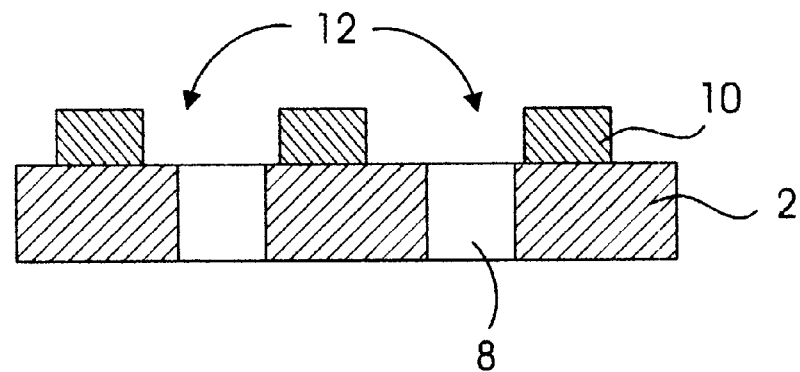

Referring to FIG. 3, the third step of the process involves lithographically patterning the layer 10 of dielectric composition to form trenches 12 (depressions) in the layer of composition. The trenches 12 shown in FIG. 3 extend to the substrate 2 and to the metallic stud 8. Lithographic patterning generally involves (i) coating the layer 10 of dielectric composition with a positive or negative photoresist such as those marketed by Shipley or Hoechst Celanese (AZ photoresist), (ii) imagewise exposing (through a mask) the photoresist to radiation such as electromagnetic e.g., UV or deep UV (iii) developing the image in the resist e.g., with suitable basic developer and (iv) transferring the image through the layer 10 of dielectric composition to the substrate 2 with a suitable transfer technique such as reactive ion beam etching. (RIE) Suitable lithographic patterning techniques are well known to those skilled in the art such as disclosed in Thompson et al., "Introduction to Microlithography", (1994), the disclosure of which is incorporated herein by reference.

Figure 4:
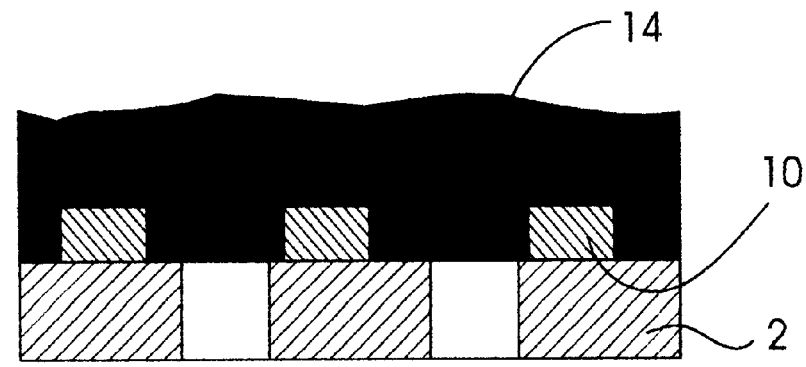

Referring to FIG. 4, in the fourth step of the process for forming the integrated circuit of the present invention, a metallic film 14 is deposited onto the patterned dielectric layer 10. Preferred metallic materials include copper, tungsten and aluminum. The metal is suitably deposited onto the patterned dielectric layer by art known techniques such as chemical vapor deposition (CVD), plasma enhanced CVD, electro and electroless deposition, sputtering or the like.

Figure 5:
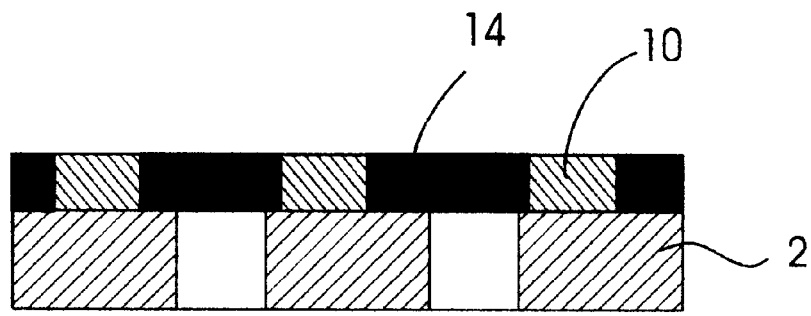

Referring to FIG. 5, the last step of the process involves removal of excess metallic material (e.g., planarizing the metallic film 14) so that film 14 is generally level with the patterned dielectric layer 10. Planarization can be accomplished using chemical/mechanical polishing or selective wet or dry etching. Suitable chemical/mechanical polishing are known to those skilled in the art.

Figure 6:
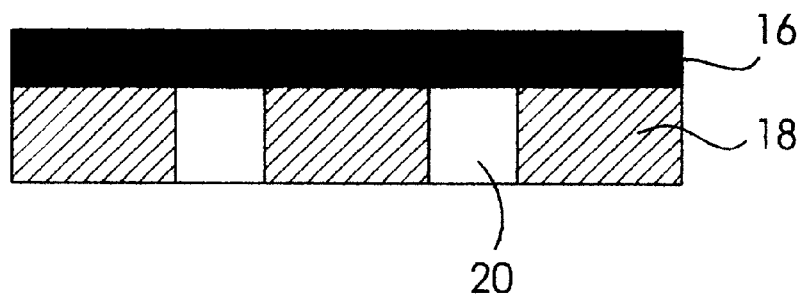
FIGS. 6–8 show an alternative process for making the integrated circuit device of the present invention.
Figure 7:
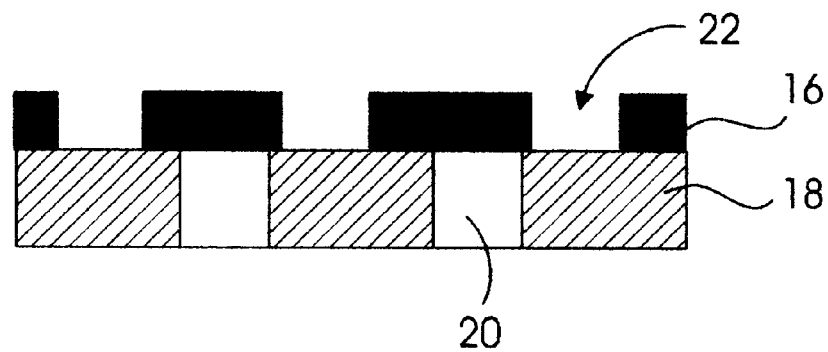
Figure 8:
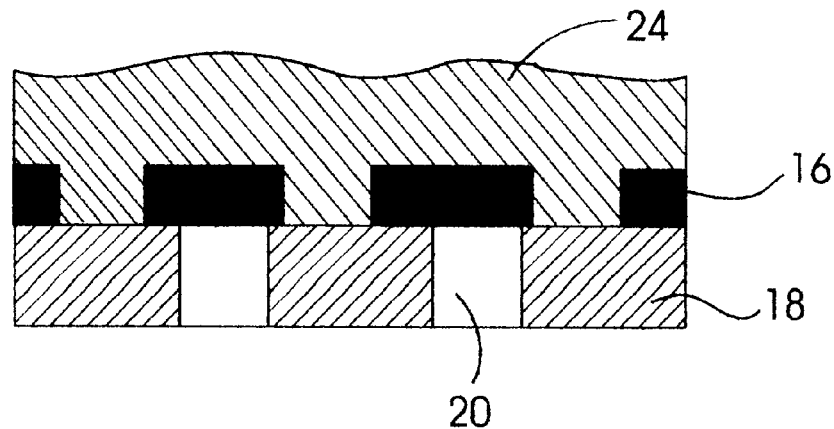

Referring to FIGS. 6–8, there is shown an alternative embodiment of the process of the present invention for making the integrated circuit devices. The first step of the process in this embodiment involves depositing a metallic film 16 onto a substrate 18. Substrate 18 is also provided with vertical metallic studs 20. Referring to FIG. 7, in the second step of the process, the metallic film is lithographically patterned through a mask to form trenches 22. Referring to FIG. 8, in the third step of the process, a layer 24 of dielectric composition of the present invention is deposited onto the patterned metallic film 16. In the last step of the process, the composition is heated to imidize the trialkoxysilylalkyl end capped polyamic ester and condense the silyl reactants. Optionally, the dielectric layer may then be planarized for subsequent process in a multilayer integrated circuit.

The following examples are detailed descriptions of the process of the present invention. The detailed preparations fall within the scope of, and serve to exemplify, the more generally described methods set forth above. The examples are presented for illustrative purposes only, and are not intended as a restriction on the scope of the invention.

EXAMPLE 1

Synthesis of Trimethoxysilyl end capped Poly(Amic Ethyl Ester)

meta-Diethyldichloropyromellitate (PMDA)

1,1-Bis(4-aminophenyl)-1-phenyl-2,2,2-trifluoroethane (3FDA)

A three-neck flask equipped with an overhead stirrer, nitrogen inlet and addition funnel was charged with 9.48 mmol (3.2456 g) 3FDA, 1.04 mmol (0.2218 g) of aminophenyltrimethoxysilane, 25 mmol (2 g) of pyridine and 50 mL of distilled NMP. The system was continuously maintained under a positive nitrogen pressure. The reaction mixture was cooled to 0° C. The PMDA diethylester diacylchloride (10 mmol, 3.4716 g) was dissolved in ~100 mL of methylene chloride and quantitatively transferred to the addition funnel. The methylene chloride solution was added dropwise to the reaction mixture. After the addition was complete, the polymerization was allowed to proceed overnight at room temperature. The poly(amic ethyl ester) oligomers were isolated by higher shear precipitation in methanol, filtered and dried in a vacuum oven at 60° C. (Mn=10,000)

EXAMPLE 2

Formation of Composition

The poly(amic ethyl ester) oligomer from Example 1 was dissolved in DMPU. To this solution, the polysilsequioxane (GR950F, from Techniglass) was added. A clear amber solution was formed with a solids content of 37 wt. % and a poly(amic alkyl ester) content of 23 wt. %. The solution was subsequently cast by spin coating onto glass plates to form films from 1 to 10 microns thick. The imidization was accomplished by heating the polymer films for 2 hrs each at 250° and 400° C. under $N_2$ atmosphere. The cured polyimide films were subsequently cooled slowly to room temperature. The cured polyimide films were crack free, exhibited phase domains of 1000 Å, a dielectric constant of about 2.9 at 80° C.; thermal stress of about 30 mPa and a refractive index of about 1.56.

Although this invention has been described with respect to specific embodiments, the details thereof are not to be construed as limitations for it will be apparent that various embodiments, changes, and modifications may be resorted to without departing from the spirit and scope thereof, and it is understood that such equivalent embodiments are intended to be included within the scope of this invention.

What is claimed is:

1. An integrated circuit device comprising:

(a) a substrate;

(b) metallic circuit lines positioned on the substrate, and (c) dielectric composition positioned contiguous to the circuit lines, the composition comprising the reaction product of organic polysilica and polyamic ester terminated with $(RO)_m(R'')_n SiR'$— where R and R' are independently a hydrocarbyl group; R" is hydrido or hydrocarbyl group; m is, 1, 2 or 3 and n+m=3.

2. The device of claim 1 wherein the organic polysilica is $C_{1-6}$ alkoxysilane, silsesquioxane or mixture thereof.

3. The device of claim 2 wherein the silsesquioxane is phenyl/$C_{1-6}$ alkyl silsesquioxane.

4. The device of claim 2 wherein the polyamic ester is terminated with a tri $C_{1-10}$ alkoxysilyl $C_{1-10}$ alkyl group or tri $C_{1-10}$ alkoxysilylaryl group.

5. The device of claim 3 wherein the polyamic ester comprises a diamine selected from 9,9'-bis(4-aminophenyl) fluorene; 4,4'oxydianiline and 1,1-bis(4-aminophenyl)-1-phenyl-2,2,2-trifluoroethane and a diester diacid halide selected from di $C_{1-6}$ alkyl dichloro pyromellitate; di $C_{1-6}$ alkyl dichloroxydiphthalate and di $C_{1-6}$ alkyl dichlorobiphenyl-tetracarboxylate.

6. The device of claim 2 wherein the dielectric composition has a dielectric constant of less than 3.2.

7. The device of claim 2 wherein the dielectric composition has phase domains less than 0.5 microns.

8. An integrated circuit packaging device for providing signal and power current to an integrated circuit chip comprising:

(i) a substrate having electrical conductor for connection to a circuit board, (ii) a plurality of alternating electrically insulating and conducting layers positioned on the substrate wherein at least one of the layers comprises the reaction product of organic polysilica and polyamic ester terminated with $(RO)_m(R'')_n SiR'$—, where R and R' are independently a hydrocarbyl group; R" is hydrido or hydrocarbyl group; m is 1, 2 or 3 and n+m=3; and (iii) a plurality of vias for electrically interconnecting electrical conductor, conducting layers and an integrated circuit chip.

9. The device of claim 8 wherein the organic polysilica is $C_{1-6}$ alkoxysilane, silsesquioxane or mixture thereof.

10. The device of claim 9 wherein the silsesquioxane is phenyl/$C_{1-6}$ alkyl silsesquioxane.

11. The device of claim 9 wherein the polyamic ester is terminated with a tri-$C_{1-10}$ alkoxysilyl $C_{1-10}$ alkyl group or tri $C_{1-10}$ alkoxysilylaryl group.

12. The device of claim 11 wherein the polyamic ester comprises a diamine selected from 9,9'-bis(4-aminophenyl) fluorene, 4,4'oxydianiline and 1,1-bis(4-aminophenyl)-1-phenyl-2,2,2-trifluoroethane, and a diester diacid halide selected from di $C_{1-6}$ alkyl dichloro pyromellitate, di $C_{1-6}$ alkyl dichlorooxydiphthalate and di $C_{1-6}$ alkyl dichlorobiphenyl-tetracarboxylate.

* * * * *